United States Patent [19]

McClure

[11] Patent Number: 5,551,004
[45] Date of Patent: Aug. 27, 1996

[54] STRUCTURE WHICH RENDERS FAULTY DATA OF A CACHE MEMORY UNCACHEABLE IN ORDER THAT A PARTIALLY FUNCTIONAL CACHE MEMORY MAY BE UTILIZED

[75] Inventor: David C. McClure, Carrollton, Tex.

[73] Assignee: SGS-Thomson Microelectronics, Inc., Carrollton, Tex.

[21] Appl. No.: 69,024

[22] Filed: May 28, 1993

[51] Int. Cl.⁶ .................................................. G06F 12/08
[52] U.S. Cl. ........................ 395/465; 395/456; 395/481
[58] Field of Search ..................... 395/400 MS, 425 MS, 395/465, 456, 481; 371/11.1, 40.2

[56] References Cited

U.S. PATENT DOCUMENTS

| | | | |
|---|---|---|---|
| 4,335,459 | 6/1982 | Miller | 371/38 |
| 4,357,656 | 11/1982 | Saltz et al. | 395/425 |
| 5,070,502 | 12/1991 | Supnik | 371/11.1 |
| 5,204,836 | 4/1993 | Reed | 365/200 |
| 5,317,711 | 5/1994 | Bourekas et al. | 395/425 |
| 5,357,521 | 10/1994 | Cheng et al. | 371/21.3 |

*Primary Examiner*—Reba I. Elmore
*Attorney, Agent, or Firm*—Renee M. Larson; Lisa K. Jorgenson

[57] ABSTRACT

According to the present invention, faulty isolated bits in the cache memory are made inaccessible to the microprocessor by rendering an appropriate line of data in the cache memory uncacheable to the microprocessor. When faulty data bits are not repairable through conventional repair means such as row/column redundancy, the tag RAM may be programmed with the address of the faulty data bit such that when the microprocessor requests data at that address, a comparator inside the tag RAM generates a signal indicative of a "miss" condition which is an output signal of the tag RAM. The miss condition is communicated to the microprocessor which must access the requested data from main memory. In this way, a cache memory having faulty data bits may still be utilized.

17 Claims, 1 Drawing Sheet

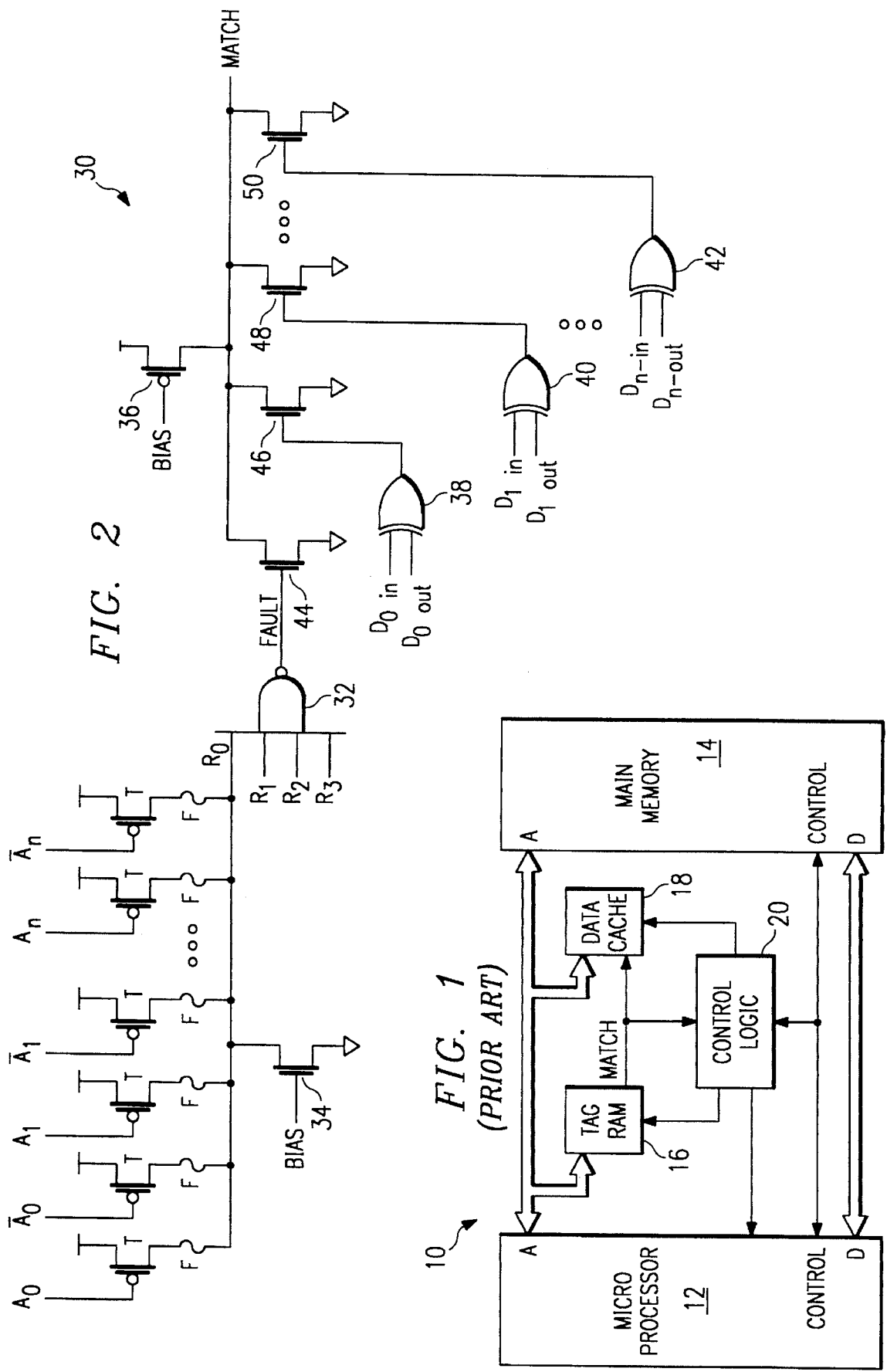

STRUCTURE WHICH RENDERS FAULTY DATA OF A CACHE MEMORY UNCACHEABLE IN ORDER THAT A PARTIALLY FUNCTIONAL CACHE MEMORY MAY BE UTILIZED

BACKGROUND OF THE INVENTION

1. Field of the Invention

The present invention relates generally to integrated circuit memory devices, and more specifically to a structure for utilizing a cache memory having faulty bits.

2. Description of the Prior Art

During the manufacture of integrated circuit memory devices, die are often discarded because certain bits of the die are defective and not easily identified and repaired at, for instance, laser repair. Even though a majority of the die may be fully functional, it is often necessary to discard the entire die as scrap if the unfunctional bits of the die are not identifiable. This problem is exacerbated when a memory device is embedded in another, more expensive device such as a microprocessor or an application specific integrated circuit (ASIC). It is undesirable to discard a costly microprocessor, for instance, just because the memory embedded in it has isolated, faulty bits. This concern for recovering the use of an integrated circuit memory die extends to technologies such as cache memories, memory cards, and memories embedded in ASICs.

Cache memories are increasingly used as primary caches embedded in high performance microprocessors or as secondary caches external to the microprocessor. As computer microprocessors have become faster and faster, the rate at which requested data must be supplied increases as well. Such memories are often used to quickly supply data requested by a microprocessor. Cache memories are an element of the typical cache system which has five elements: the microprocessor, main memory, the tag Random Access Memory (RAM), the cache memory, and control logic. The cache memory can be embedded in the microprocessor, in which case it is a "primary cache", or it may be a discrete component, external to the microprocessor, in which case it is called a "secondary cache". The tag RAM holds the address locations of all data which is stored in the data cache. The tag may be associated with a "line" of data in the cache memory, where the line is a block of data which can be one or several consecutive bytes or words of data. When the microprocessor requests information, a read signal is immediately sent to both the main memory and the tag RAM. The tag RAM compares the requested memory address with the memory address of all data stored in the cache memory. If the requested memory address is in the tag RAM, a "hit" condition exists, and data from that location will be gated from the cache memory to the microprocessor.

In a "hit" condition, the tag RAM generates a valid compare Match output signal. In the hit condition, the cache memory gates the required data onto the data bus before the main memory can respond. In this way, microprocessor wait states are avoided. However, if the tag RAM's comparison operation indicates that the desired data is not stored inside the cache memory, a "miss" condition exists, and the data must come from main memory which typically holds more data than the cache memory and is therefore much slower. As a result, the microprocessor may have to wait for several cycles, during which time it is idle, before receiving requested data from slow main memory. These unproductive cycles are referred to as "wait states" since the microprocessor must wait until the requested data is provided from main memory.

A cache memory, having randomly occurring bit(s) failures which are not easily detected and bypassed, is often discarded. Unfortunately, memory devices may suffer from high, but random, incidences of isolated bit failures due to randomly occurring process problems such as particle defects. These failures may not be easily repaired, especially if no row or column redundancy testing is employed. Even when redundancy testing at laser repair is used, this technique may not be sufficient to ferret out all such random failures. When a cache memory having bit(s) failures is resident in microprocessors, ASICs, or other devices, the faulty cache memory, along with the expensive fully functional device in which it is embedded, is often discarded. Therefore, there is an unmet need in the art to compensate for random bit(s) failures in cache memories such that they are rendered usable. It would be desirable to bypass defective data locations in the cache memory such that a cache memory and any device in which it is embedded is not scrapped.

SUMMARY OF THE INVENTION

It would be advantageous in the art to bypass faulty, isolated bit locations in a cache memory so as to prevent data from being cached in these locations and later provided to a microprocessor.

Therefore, according to the present invention, faulty isolated bits in the cache memory are made inaccessible to the microprocessor by rendering an appropriate line of data in the cache memory uncacheable to the microprocessor. When faulty data bits are not repairable through conventional repair means such as row/column redundancy, the tag RAM may be programmed with the address of the faulty data bit such that when the microprocessor requests data at that address, a comparator inside the tag RAM generates a signal indicative of a "miss" condition which is an output signal of the tag RAM. The miss condition is communicated to the microprocessor which must access the requested data from main memory. In this way, a cache memory having faulty data bits may still be utilized.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1 is a block diagram of a cache system according to the prior art; and

FIG. 2 is a schematic diagram of circuitry used to identify addresses in the tag RAM according to a preferred embodiment of the present invention.

DESCRIPTION OF THE INVENTION

During the manufacture of cache memory devices, random, isolated bit failures are often caused by process problems such as particle contamination. These failures, if not identified and compensated for, can often render an otherwise functional cache memory unusable, especially a primary cache memory which is embedded in the microprocessor of a cache system. In this case, random process defects can result in the scrapping of not only the primary cache memory, but also the fully functional microprocessor as well.

FIG. 1 shows a block diagram of a cache system according to the prior art. A typical cache system 10 is comprised of five main elements: microprocessor 12, main memory 14, tag RAM 16, cache memory 18, and control logic 20. Because the cache memory is separate from the microprocessor, cache system 10 is a secondary cache system which has been shown for clarity. In a primary cache system, cache memory is embedded in the microprocessor, and therefore is sometimes called embedded cache memory. The microprocessor 12 could obtain all needed data from the slow main memory 14. However, since the typical main memory is much slower than the typical microprocessor, the microprocessor 12 must incur "wait states" until the data arrives from main memory 14. During wait states, microprocessor 12 is idle. Wait states have a negative impact on the efficiency of the processor and, therefore, on computer performance.

For these reasons, cache system 10 is used to provide the microprocessor with data in a more timely fashion, in the hopes of reducing or even eliminating microprocessor wait states. The secondary cache system, composed of a tag RAM 16, a cache memory 18, and control logic 20, resides between the microprocessor 12 and main memory 14. Smaller and faster than main memory 14, cache memory 18 stores a copy of frequently accessed main memory data. Storing data commonly accessed by the microprocessor 12, increases the likelihood that cache memory 18 will have the needed data in the event of a microprocessor memory cycle.

Transparent to main memory 14, the cache memory 18 supplies data to microprocessor 12 if it has the requested data. The tag RAM 16 provides the mechanism by which it is determined if the cache memory 18 has the data requested by the microprocessor 12. The tag RAM 16 stores the memory addresses of all data stored in the cache memory 18. Upon a microprocessor read, the tag RAM 16 compares the address of the data being sought with the addresses of data stored in the cache memory 18. If a "hit" or match condition exists, the tag RAM 16 generates a logic high Match output signal which indicates that cache memory 18 does have the desired data. Data from the cache memory 18 is then gated onto the data bus where it is received by the microprocessor 12. If, however, the tag RAM 16 determines the desired data address does not match any addresses stored in the cache memory 18, a "miss" condition exists. In response to a "miss" condition, the tag RAM 16 generates a logic low Match output signal.

Once tag RAM 16 has performed a comparison operation and determined if the cache memory 18 contains the data of the memory address being requested, it generates a Match output signal. The Match output signal is an input to cache memory 18 and functions as a high-speed chip select which allows or does not allow data from the cache memory to be gated onto the data bus to the microprocessor. If the tag RAM comparison function indicates a "hit" condition, meaning that the cache memory has the requested data, then the cache memory outputs are simply enabled. If a "miss" condition is indicated, meaning that the cache memory does not have the requested data, the outputs of the cache memory 18 are not enabled and main memory 14 will ultimately supply the data to the microprocessor 12. When a "miss" occurs, the unnecessary read does not cause problems because the contents of the cache memory location are typically updated with the requested data. This parallel activity during cache memory read cycles saves time and can possibly allow the data to be read by the microprocessor 12 in a single cycle, with no wait states.

According to the present invention, faulty isolated bits in the cache memory are identified and made inaccessible to the microprocessor by rendering an appropriate line of data in the cache memory uncacheable to the microprocessor. The tag RAM is used to control access to particular data. If faulty data bits are not repairable through conventional repair means such as row/column redundancy, the tag RAM may be programmed with the address of the faulty data bit or tag bit such that when the microprocessor requests data at that address, a comparator inside the tag RAM generates a signal indicative of a "miss" condition which is an output signal of the tag RAM. The miss condition is communicated to the microprocessor which must access the requested data from main memory.

Referring to FIG. 2, a schematic diagram of circuitry 30 used to bypass addresses in the tag RAM according to the present invention is shown. A0, A0-bar, A1, A 1-bar, . . . , An, and An-bar are the address bits of the index of the tag RAM and represent addressable space in the cache memory. The index of the tag is the least significant bits (LSBs) of the address field, used to address a given tag location. Consider the case where all address bits are a logic high level for a faulty address. Fuses F associated with complement address bits A0-bar, A1-bar, An-bar, etc. are blown to disconnect transistors T from node R0. Therefore, if the faulty address is presented, all true address bits will be a logic high. Since each true address bit is a logic high, all p-channel transistors T, whose fuses have not been blown, are off, and R0, the result of wire-ORing together fuses F, is a logic low.

Nodes R1, R2, and R3 are each analogous to node R0, and are the result of the same type of circuitry that produced node R0. Since circuitry 30 has nodes R0, R1, R2, and R3, up to four addresses may be bypassed and made non-cacheable; however, any number of addresses may be bypassed by simply duplicating the circuitry 30. XOR gates 38, 40, and 42 compare the data stored in a particular memory location and being read out of cache memory, such as $D_{n\text{-}out}$, with the data being presented, such as $D_{n\text{-}in}$, to determine if a "Hit" or "Miss" condition exists. When R0 is low, FAULT, the output signal of NAND gate 32, is a logic high. The MATCH signal is forced to a logic low, a condition indicative of a Miss condition. When the MATCH signal is a logic low, that tag RAM address is identified as a Miss condition and the corresponding data in the cache memory is made inaccessible to the microprocessor so that the requested data must be retrieved from main memory.

The circuitry 30 of FIG. 2 is but one way of bypassing faulty data in a cache memory. One skilled in the art will appreciate that variations in circuitry may be used to accomplish the same result. For instance, the functions performed by the fuses F of FIG. 2 may also be performed with registers and slightly different circuitry.

Because the tag RAM has a close correspondence to the cache memory, a bit failure in either the tag RAM or cache memory can be handled through the tag RAM by forcing a Miss for that tag location. As mentioned with respect to FIG. 2, a line of data may be disabled. It may also be advantageous to partition the memory with bits of an associated address physically adjacent to each other, such as DQ0,1,2,3,4, etc. (where the term "DQ" refers to a Data input/output signal), and not with bits associated with a DQ physically adjacent such as all DQ0 bits together, then all DQ1 bits together, etc. In this way, adjacent cell failures are more likely to be covered by a single faulty address and not by several faulty addresses. This is particularly true in the tag RAM, but may not necessarily be true in the cache memory, if the adjacent cells are grouped in a cache line. This is because an entire data line is associated with the tag entry.

It may be more efficient to simply render an individual word, rather than an entire line of data, non-cacheable. For example, the Fault signal generated in FIG. 2 could be communicated directly to the microprocessor rather than the tag RAM. The microprocessor would then be notified that an individual word is invalid in the cache memory and must therefore be retrieved from main memory. In this scenario, the fused wired NAND gate 32 of FIG. 2 must use all address terms and not just the index address for a data line location. Alternatively, the R0 node signal could be fed to the microprocessor as a separate signal to notify the microprocessor when a single word location is bad, in which case it would not need to be part of the tag RAM comparator circuitry.

For a direct-mapped cache system, whenever data from a faulty location is requested, a "Miss" will be generated by the tag RAM, and the requested data will have to be supplied by the main memory, as described above. Isolated, random faulty bits of the type being discussed are not likely to be numerous after redundancy testing is exhausted. Depending on the number of defects which render isolated bits uncacheable, only a very small portion of the total tag data entries will be inaccessible. As an example, a tag RAM with 16 K data entries and one defect will only suffer approximately a 0.0061% degradation in the number of valid tag entries and data locations in the cache memory.

An even smaller degradation in performance is possible with a set-associative cache system. In a two-way set-associative cache system, for example, the cache is split into two smaller, somewhat independent caches. This allows for two tags to be stored for a given index address and the two associated lines of data in each cache memory; the index of the tag is the least significant bits (LSBs) of the address field, used to address a given tag location. Set-associative cache systems typically possess higher hit rates than a comparable direct mapped cache, although there is some added complexity, embodied in replacement algorithms which determine what cache location of which tag RAM to overwrite upon a miss condition.

In a two-way set-associative cache system, which has a defective data bit in one of the two cache sets, the faulty location is made non-cacheable. However, the other cache memory data location is not faulty so that the data at that location can still be cached in that set. The cache efficiency of the faulty location is slightly reduced since only one of the two cache memories is known to have the correct data for the given tag index. If this concept is applied to a four-way set-associative cache system with only a faulty bit in only one of the four cache memories, the other three cache memories would still be able to provide the correct data, and, in this case, the performance degradation would be virtually undetectable. Of course, the faulty bit has to be communicated to the microprocessor such that the replacement algorithm logic does not allow data to be written to that faulty location but only to the remaining cache memories for which that location is fully functional.

The present invention provides circuitry which identifies and renders a faulty data bit or data line uncacheable, effectively bypassing the faulty data. When a faulty address has been identified, the tag RAM is forced to generate a Match signal indicative of a Miss condition. The cache memory data corresponding to a faulty tag RAM address will not be allowed to be supplied to the microprocessor. An otherwise fully functional cache memory, either embedded or secondary, having isolated bit(s) failures or other failure mechanisms may be rendered functional with the present invention. Other types of failure mechanisms may include multiple bit failures, a locked row, or a locked column. ASICs and microprocessors, having embedded partially functional cache memory, or external cache memory may be salvaged. Improving memory device yield will become more important as larger cache memories are embedded in microprocessors as primary cache; improved memory yield will allow expensive microprocessors to be salvaged with little or no performance degradation. Also, the present invention allows for increased memory density in a cache system, such as more primary cache memory embedded in a microprocessor, because every bit in the cache memory need not be fully functional for the cache system to operate at an acceptable level.

While the invention has been particularly shown and described with reference to a preferred embodiment, it will be understood by those skilled in the art that various changes in form and detail may be made therein without departing from the spirit and scope of the invention. For instance, circuitry 30 of FIG. 2 can take many forms to make a faulty line of data or a single faulty data bit location inaccessible.

What is claimed is:

1. Circuitry for bypassing faulty data locations in cache memory, comprising:

a cache memory, having at least one faulty data location, which store a plurality of data;

a tag RAM which stores a plurality of addresses of the plurality of data stored in the cache memory; and bypass circuitry of the tag RAM which forces the tag RAM to generate a predetermined output signal indicative of a Miss condition for a tag RAM address which corresponds to the at least one faulty data location, such that the at least one faulty data location is permanently bypassed and thus made uncacheable without the need for monitoring and setting a bit whose sole function is to communicate if the at least one faulty data location is faulty, wherein the predetermined output signal is received by a microprocessor.

2. The circuitry of claim 1, wherein the cache memory is a primary cache memory.

3. The circuitry of claim 2, wherein the primary cache memory is embedded in the microprocessor.

4. The circuitry of claim 1, wherein the cache memory is embedded in an application specific integrated circuit (ASIC).

5. The circuitry of claim 1, wherein the cache memory is part of a direct-mapped cache system.

6. The circuitry of claim 1, wherein the cache memory is part of a set-associative cache system and is split into a plurality of cache memory sets.

7. The circuitry of claim 6, wherein the cache memory is split into two cache sets in a two-way set-associative cache system.

8. The circuitry of claim 6, wherein the cache memory is split into four cache sets in a four-way set-associative cache system.

9. The circuitry of claim 1, wherein the tag RAM or the cache memory are partitioned such that memory cells associated with an address are physically adjacent to each other.

10. The circuitry of claim 1, wherein the memory cells of the cache memory are partitioned such that the memory cells of a data line are physically adjacent to each other.

11. The circuitry of claim 1, wherein a faulty word in cache memory is made uncacheable by communicating an address of the faulty word directly to the microprocessor without forcing the tag RAM to generate the predetermined output signal.

12. The circuitry of claim 1, wherein an entire cache memory data line is made uncacheable if the at least one faulty data location is found in the cache memory data line or in a tag RAM location corresponding to the cache memory data line.

13. The circuitry of claim 1, wherein the bypass circuitry for forcing the tag RAM to generate the predetermined output signal for a the tag RAM address which corresponds to the at least one faulty data location, further comprises:

- a plurality of transistors, each having a gate, a first transistor terminal and a second transistor terminal, with the first transistor terminal connected to a first supply voltage;
- a plurality of true and complement address bits which define the tag RAM address, each of which is connected to the gate of a corresponding transistor;
- a plurality of fuses, each having a first fuse terminal and a second fuse terminal, with the first fuse terminal connected to the second terminal of a corresponding transistor;
- compare circuitry which generates the predetermined output signal for the tag RAM address which corresponds to the at least one faulty data location; and
- a node connected to the second fuse terminal of each of the plurality of fuses and to a second supply voltage through a bias transistor having a gate, a first terminal, and a second terminal, wherein a voltage level of the node determines if the compare circuitry will be forced to generate the tag RAM output signal, and wherein the first terminal of the bias transistor is connected to the node and the second terminal of the bias transistor is connected to the second supply voltage.

14. The circuitry of claim 13, wherein the predetermined output signal is a Match output signal of the tag RAM.

15. The circuitry of claim 13, wherein the first supply voltage is $V_{cc}$ and the second supply voltage is ground.

16. The circuitry of claim 13, wherein the gate of the bias transistor is driven by a bias signal.

17. The circuitry of claim 13, wherein at least one of the plurality of fuses is blown to identify the at least one faulty data location.

* * * * *